United States Patent [19]

Nagatomi

[11] Patent Number: 4,542,300
[45] Date of Patent: Sep. 17, 1985

[54] HIGH FREQUENCY SIGNAL SWITCHING DEVICE

[75] Inventor: Akihiko Nagatomi, Kobe, Japan

[73] Assignee: DX Antenna Company, Limited, Kobe, Japan

[21] Appl. No.: 524,321

[22] Filed: Aug. 18, 1983

[30] Foreign Application Priority Data

Aug. 25, 1982 [JP] Japan .................. 57-129039[U]

[51] Int. Cl.$^4$ ................................ H03H 7/48
[52] U.S. Cl. ........................ 307/112; 333/103; 340/825.03; 307/146
[58] Field of Search .............. 307/72, 80, 85, 86, 307/146, 112, 116; 340/825.03; 455/188, 190; 333/101, 103

[56] References Cited

U.S. PATENT DOCUMENTS 3,368,200  2/1968  McNicol .................. 340/825.03
3,469,151  9/1969  Newland ................ 340/825.03 X
4,492,937  1/1985  Theriault .................... 333/103

OTHER PUBLICATIONS

"Practical Electronic Circuit Handbook, Part 4", p. 344, Figure 2-97, Published by C. Q. Shuppan, K.K. Tokyo, Jan.-1970.

Primary Examiner—A. D. Pellinen
Assistant Examiner—Derek S. Jenning
Attorney, Agent, or Firm—Eugene E. Geoffrey, Jr.

[57] ABSTRACT

An improved high frequency signal changeover switch is provided for use especially as a horizontal-vertical selection switch in an artificial satellite broadcast receiving system for the purpose of selectively delivering either vertical or horizontal polarization signals received at its two inputs, respectively, from its single output. This inventive switch has such a significant feature over the prior art switches in that no mismatch occurs among all of these terminals.

2 Claims, 7 Drawing Figures

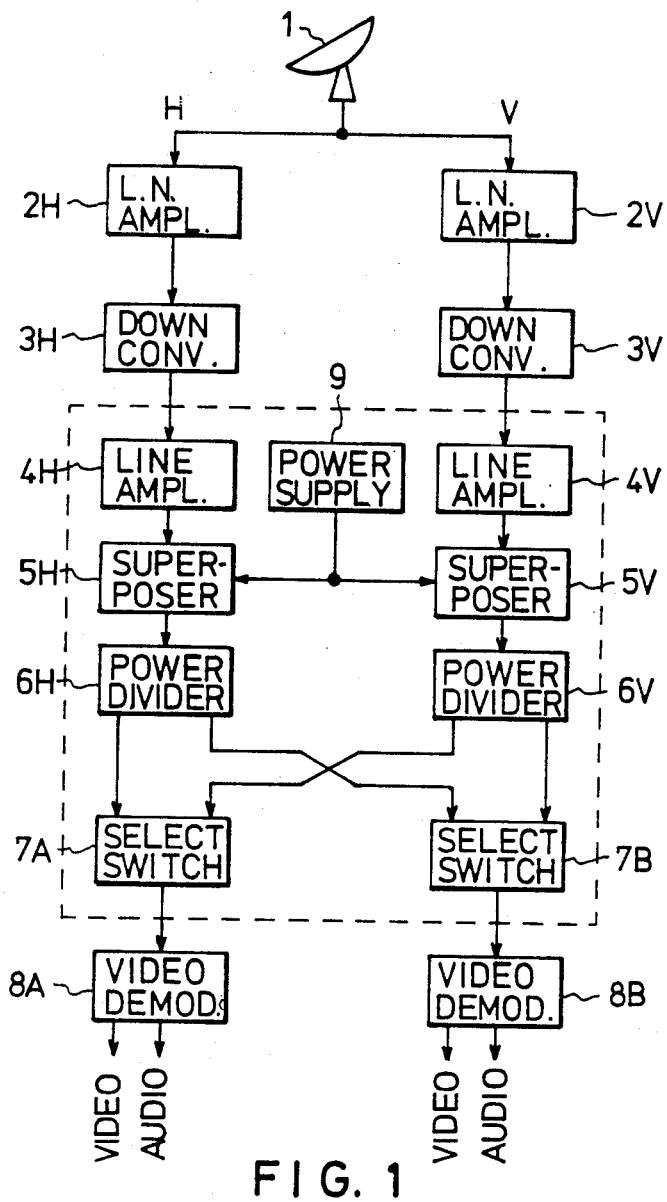
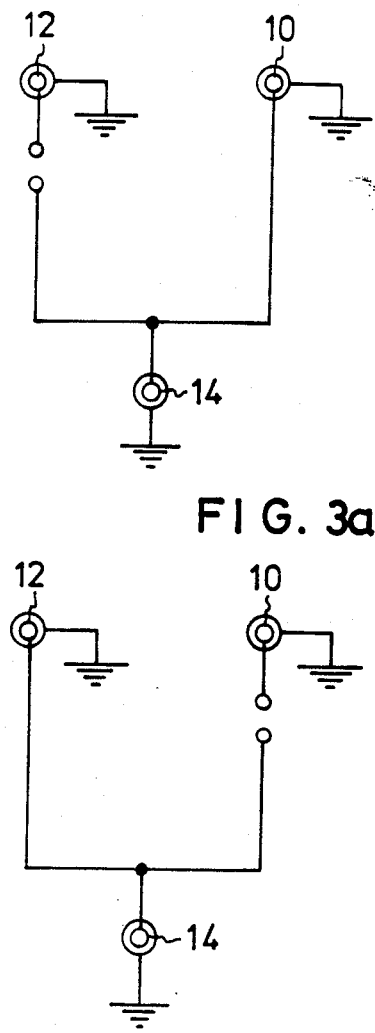
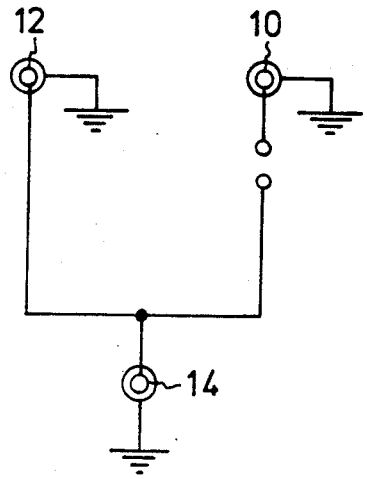
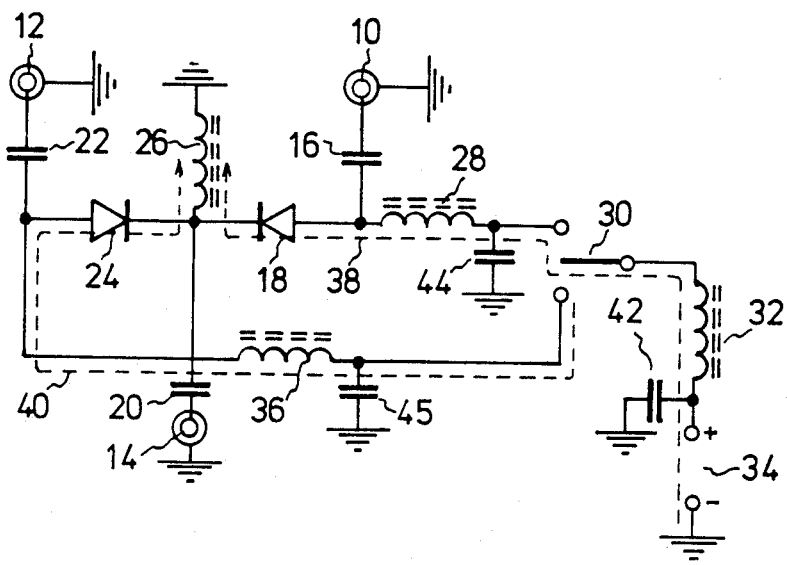
FIG. 1 (PRIOR ART)
FIG. 3a
FIG. 3b (PRIOR ART)
FIG. 2 (PRIOR ART)

HIGH FREQUENCY SIGNAL SWITCHING DEVICE

This invention relates generally to a high frequency signal switching device and especially to a high frequency signal changeover switch used for selectively delivering either of two high frequency signals received at its two inputs, respectively, from its single output.

As described in detail later, in an artificial satellite broadcast receiving system, vertical and horizontal polarization signals received by a parabolic antenna are amplified, frequency-converted and otherwise processed in separate processing channels, and then supplied selectively to a demodulator for recovering video and audio information. To this end, a changeover switch is inserted before the demodulator for selectively applying either of the vertical or horizontal polarization signals to the demodulator. An example of such a changeover switch is disclosed in FIG. 2-97 of page 344 of "Practical Electronic Circuit Handbook, Part 4" edited by DX Antenna Co., Ltd., Kobe, Japan and published by CQ Shuppan K.K., Tokyo in 1980. However, the prior art changeover switches of this type have had the disadvantage of a mismatch between their input and output terminals which may result in undesirable visual disturbance in the displayed image.

Therefore, an object of this invention is to provide an improved high frequency signal switching device which does not cause an unwanted mismatch.

This object can be completely attained by the high frequency signal changeover switch according to this invention, which includes first and second inputs for receiving first and second high frequency signals, respectively, and an output for delivering either of the input signals. A first pin diode is connected between the first input and the output to conduct DC operation current of a first polarity, and a second pin diode is connected between the second input and the output to conduct DC operation current of a second polarity. As a feature of this invention, a third pin diode is connected in series with the first impedance elements between the second input and a reference potential point to form therewith a dummy impedance, and a fourth pin diode is connected in series with the second impedance elements between the first input and the reference potential point to form therewith another dummy impedance.

The above and other features and operation of this invention will be described in more detail hereinunder with reference to the accompanying drawings.

IN THE DRAWINGS

FIG. 1 is a block diagram representing a typical satellite broadcast receiving system including high frequency signal changeover switches;

FIG. 2 is a schematic circuit diagram representing a typical example of a prior art high frequency signal changeover switch used in the system of FIG. 1;

FIG. 3a and 3b are equivalent circuit diagrams representing two switching states of the circuit of FIG. 2;

Figure 4:
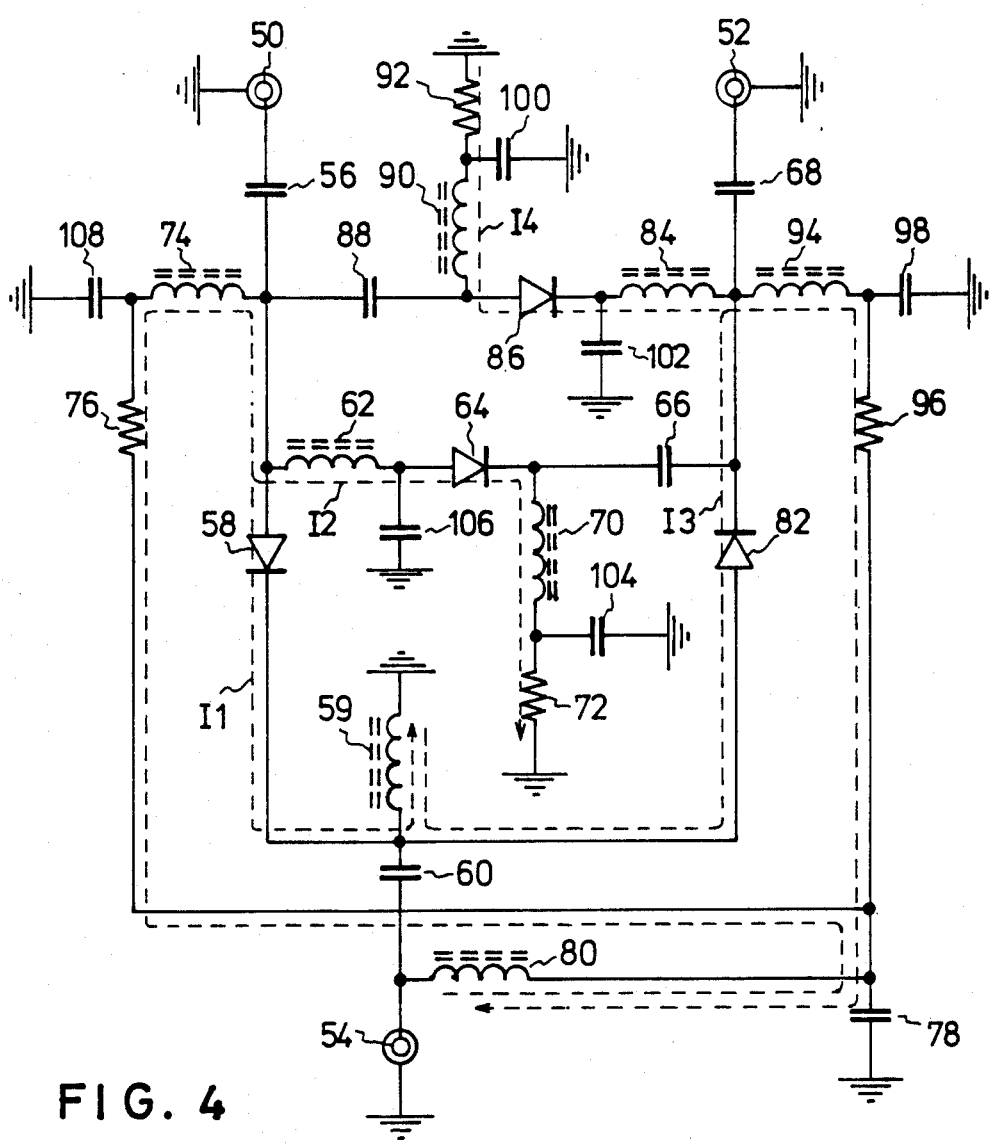
FIG. 4 is a schematic circuit diagram representing an embodiment of a high frequency signal changeover switch according to this invention.

Referring to FIG. 1, horizontal and vertical polarizations of a satellite broadcast television signal in 4 GHz band (3.7 to 4.2 GHz) received by a parabolic antenna 1 are treated in separate channels H and V, respectively, as shown. The horizontal polarization signal is amplified by a low-noise amplifier 2H, converted by a down-converter 3H into an intermediate frequency signal of 0.9 to 1.4 GHz and then amplified by a line amplifier 4H. The vertical polarization signal is also treated similarly by a low-noise amplifier 2V, down-converter 3V and line amplifier 4V, sequentially. Both output signals of the amplifiers 4H and 4V are supplied respectively through superposers 5H and 5V to power dividers 6H and 6V. For example, the power dividers 6H and 6V are two-way power dividers each having two outputs. Two outputs of the dividers 6H and 6V are coupled to a pair of inputs of a first selection switch 7A and the other two outputs are coupled to a pair of inputs of a second selection switch 7B. Here, each selection switch is the subject of this invention and serves to receive the horizontal polarization signal from the power divider 6H in its first input and the vertical polarization signal from the power divider 6V in its second input and delivers either the horizontal or vertical polarization signals selectively from its output. The selected output signals of the selection switches 7A and 7B are coupled to video demodulators 8A and 8B, respectively, which demodulate their input signals to produce video and audio output signals for application to conventional television receivers. In order to supply DC operation current to the line amplifiers 4H and 4V, down-convertors 3H and 3V and low-noise amplifiers 2H and 2V, a power supply 9 is coupled to the superposers 5H. A dashed block in FIG. 1 shows that the components in the block are generally enclosed in a waterproof housing in practice.

FIG. 2 shows a typical example of a prior art circuit which is a modification of the aforementioned circuit disclosed in the cited reference and has been used as a high frequency signal changeover switch, such as the selection switches 7A and 7B in FIG. 1. In the drawing, 10 and 12 denote first and second input terminals to be coupled through coaxial cables to receive horizontal and vertical polarization signals, for example, respectively, and 14 denotes an output terminal to be coupled through a coaxial cable to a utilization circuit. The first input 10 is connected through a capacitor 16 to the anode of a pin diode 18 whose cathode is connected through a capacitor 20 to the output 14. The second input 12 is connected through a capacitor 22 to the anode of a pin diode 24 whose cathode is directly connected to the cathode of the pin diode 18. Further, the cathodes of pin diodes 18 and 24 are grounded, in common, through RF choke 26 and the anodes of pin diodes 18 and 24 are connected, respectively, through RF chokes 28 and 36 to fixed contacts of a changeover switch 30, which are grounded through capacitors 44 and 45, respectively. The movable arm of switch 30 is connected through RF choke 32 to an operation current source 34 which is by-passed through a capacitor 42.

When the switch 30 is turned to the upside in the drawing to cause positive current to flow from the current source 34 to ground as shown by dashed line 38, the pin diode 18 conducts to form a high frequency conduction path therethrough between the first input 10 and the output 14, as shown in FIG. 3a. However, since the pin diode 24 is left non-conductive and no high frequency conduction path is formed between the second input 12 and the output 14, only the high frequency signal applied to the first input 10, such as a horizontal polarization signal, is transferred to the output 14. Inversely, when the switch 30 is turned to the underside to cause positive current to flow from the source 34 to ground as shown by dashed line 40, the pin diode 24 conducts to form a high frequency conduction path therethrough between the second input and the output, as shown in FIG. 3b. However, since the pin diode 18 is left non-conductive and no high frequency conduction path is formed between the first input and the output, only the high frequency signal applied to the second input 12, such as a vertical polarization signal, is transferred to the output 14.

As readily understood from the equivalent circuit diagrams of FIGS. 3a and 3b, the aforementioned essential disadvantage of such a prior art circuit is due to the fact that the second input terminal 12 is completely disconnected from the output terminal 14 when a high frequency conduction path is formed between the first input terminal 10 and the output terminal 14, and the first input terminal 10 is completely disconnected from the output terminal 14 when the conduction path is formed between the second input terminal 12 and the output terminal 14, thereby putting all terminals in the condition of mismatch.

From this point of view, the circuit of this invention is arranged to avoid such mismatch condition by inserting automatically a dummy impedance between one input terminal and a point of reference potential, such as ground, when the high frequency conduction path is formed between the other input terminal and the output terminal. The inventive circuit will be described hereinunder with reference to FIGS. 4 and 5.

In FIG. 4, numerals 50 and 52 denote first and second input terminals corresponding to 10 and 12 of FIG. 2, respectively, and 54 denotes the output terminal corresponding to 14 of FIG. 2. The first input terminal 50 is connected through a capacitor 56 to the anode of pin diode 58 and the second input terminal 52 is connected through a capacitor 68 to the cathode of pin diode 82. The cathode of pin diode 58 and the anode of pin diode 82 are connected in common to the output terminal 54 through a capacitor 60 and also grounded through a RF choke 59. The anode of pin diode 58 is connected through a RF choke 62 to the anode of pin diode 64 whose cathode is connected to the cathode of pin diode 82 and also grounded through a RF choke 70 and a parallel connection of resistor 72 and capacitor 104. The cathode of pin diode 82 is connected through a RF choke 84 to the cathode of pin diode 86 whose anode is connected through a capacitor 88 to the anode of pin diode 58 and also grounded through a RF choke 90 and a parallel connection of resistor 92 and capacitor 100. The cathode of pin diode 86 and the anode of pin diode 64 are grounded through capacitors 102 and 106, respectively. The anode of pin diode 58 is further connected through a series connection of RF choke 74, resistors 76 and 96 and RF choke 94 to the cathode of pin diode 82. The junction of resistors 76 and 96 is connected to the output terminal 54 through a RF choke 80 and also to ground through a capacitor 78. The junction of choke 74 and resistor 76 and the junction of choke 94 and resistor 96 are grounded through capacitors 108 and 98, respectively.

Figure 5A:
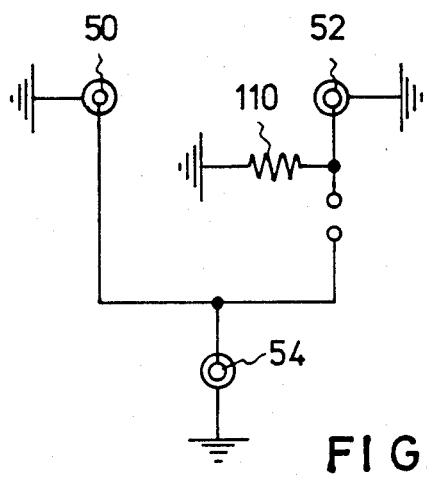
FIGS. 5a and 5b are equivalent circuit diagrams representing two switching states of the circuit of FIG. 4.

In operation, when positive operation potential is applied to the output terminal from a suitable potential source (not shown), positive current flows from the output terminal 54 through RF choke 80, resistor 76 and RF choke 74 and, on one hand, through pin diode 58 and RF choke 59 to ground as shown by dashed line l1 and, on the other hand, through RF choke 62, pin diode 64, RF choke 70 and resistor 72 to ground as shown by dashed line l2. Thus, the pin diode 58 conducts to form a high frequency conduction path between the first input terminal 50 and the output terminal 54 through capacitor 56, pin diode 58 and capacitor 60. At this time, reference potential is applied to the anode of pin diode 82 through RF choke 59 and to the anode of pin diode 86 through resistor 92 and RF choke 90 to keep these pin diodes 82 and 86 in non-conductive state. Therefore, the second input terminal 52 is disconnected from the output terminal 54 and only the high frequency signal applied to the first input terminal 50 is transferred to the output terminal 54. As the pin diode 64 is conducting, the second input terminal 52 is AC coupled to ground through capacitors 68 and 66, pin diode 64 and capacitor 106. Thus, the equivalent circuit is as shown in FIG. 5a, in which the second input terminal 52 is disconnected from the output terminal 54 as in the prior art of FIG. 3a but is grounded through a dummy impedance 110. If the component values of 68, 66, 64 and 106 are selected to make the dummy impedance 110 equal to the characteristic impedance of the second input terminal 52, the whole circuit will be put in the condition of matching.

Figure 5B:
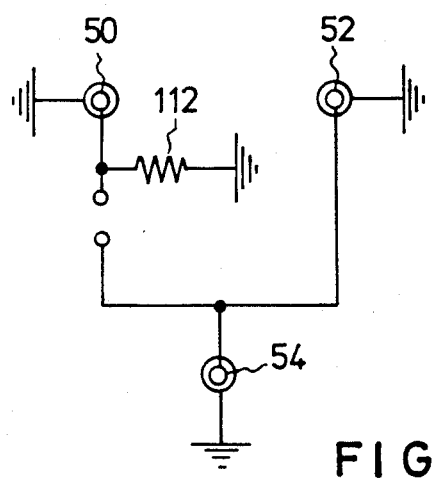

When a negative operation potential is applied to the output terminal 54, positive current flows from ground on one hand, through RF choke 59 and pin diode 82 as shown by dashed line l3 and, on the other hand, through resistor 92, RF choke 90, pin diode 86 and RF choke 84 as shown by dashed line l4, and then through RF choke 94, resistor 96 and RF choke 80 to the output terminal 54. Thus, the pin diode 82 conducts to form a high frequency conduction path between the second input terminal 52 and the output terminal 54 through capacitor 68, pin diode 82 and capacitor 60. At this time, a negative potential is applied from the output terminal 54 through RF choke 80, resistor 76 and RF choke 74 to the anode of pin diode 58, and also through RF choke 62 to the anode of pin diode 64 to keep these pin diodes 58 and 64 in non-conductive state. Therefore, the first input terminal 50 is disconnected from the output terminal 54 and only the high frequency signal applied to the second input terminal 52 is transferred to the output terminal 54. As the pin diode 86 is conducting, the first input terminal 50 is AC coupled to ground through capacitors 56 and 88, pin diode 86 and capacitor 102. Thus, the equivalent circuit is as shown in FIG. 5b, in which the first input terminal 50 is disconnected from the output terminal 54 as in the prior art of FIG. 3b but is grounded through a dummy impedance 112. If the component values of 56, 88, 86 and 102 are selected to make the dummy impedance 112 equal to the characteristic impedance of the first input terminal 50, the whole circuit will be put in the condition of matching.

As described above, in the switching circuit of this invention, the first and second input terminals are selectively connected to the output terminal and, at the same time, the disconnected input is automatically grounded through a dummy impedance to keep the circuit always in matching condition, by applying positive and negative operation potentials selectively to the output terminal. It is not necessary to use any additional conductor means for applying this operation potential, since the potential can be superposed on the coaxial cable connected to the output terminal for deriving the high frequency output signal. Though the illustrated circuit is considered most preferable for this reason, it is also possible to apply the operation potential by other circuit configurations. For example, the resistors 76 and 96 are disconnected from each other and AC coupled separately to ground through respective capacitors, and positive and negative potentials may be applied through the resistors 76 and 96, respectively and selectively.

What is claimed is:

1. A high frequency signal changeover switch comprising first and second input terminals for receiving first and second high frequency input signals, respectively; an output terminal for delivering either of said input signals, selectively; a first pin diode connected between said first input terminal and said output terminal for responding to applied DC operation current of a first polarity to conduct and a second pin diode connected between said second input terminal and said output terminal for responding to applied DC operation current of a second polarity to conduct, a third pin diode connected in series with a first impedance means between said second input terminal and a reference potential point for creating a first dummy impedance in response to said DC operation current of a first polarity to match the impedance of the second input terminal and a fourth pin diode connected in series with a second impedance means between said first input terminal and said reference potential point for creating a second dummy impedance in response to said DC operation current of a second polarity to match the impedance of the first input terminal, said third and fourth pin diodes each being connected through individual impedance means.

2. A high frequency signal changeover switch according to claim 1 wherein one electrode of said first pin diode and the other electrode of said second pin diode are DC coupled respectively to said output terminal, thereby allowing application of said operation current through said output terminal.

* * * * *